(12) United States Patent
Nakata

(10) Patent No.: US 11,387,158 B2
(45) Date of Patent: Jul. 12, 2022

(54) SEMICONDUCTOR DEVICE AND SEMICONDUCTOR ELEMENT

(71) Applicant: Mitsubishi Electric Corporation, Tokyo (JP)

(72) Inventor: Yosuke Nakata, Tokyo (JP)

(73) Assignee: Mitsubishi Electric Corporation, Tokyo (JP)

( * ) Notice: Subject to any disclaimer, the term of this patent is extended or adjusted under 35 U.S.C. 154(b) by 5 days.

(21) Appl. No.: 16/905,733

(22) Filed: Jun. 18, 2020

(65) Prior Publication Data

US 2021/0066150 A1    Mar. 4, 2021

(30) Foreign Application Priority Data

Sep. 4, 2019    (JP) .............................. JP2019-160881

(51) Int. Cl.
| | |
|---|---|
| *H01L 23/31* | (2006.01) |
| *H01L 29/16* | (2006.01) |
| *H01L 23/00* | (2006.01) |
| *H01L 23/16* | (2006.01) |
| *H01L 23/29* | (2006.01) |

(52) U.S. Cl.
CPC .......... *H01L 23/3135* (2013.01); *H01L 23/16* (2013.01); *H01L 23/293* (2013.01); *H01L 23/562* (2013.01); *H01L 29/1608* (2013.01)

(58) Field of Classification Search
CPC ... H01L 23/3135; H01L 23/16; H01L 23/293; H01L 23/562; H01L 29/1608
See application file for complete search history.

(56) References Cited

U.S. PATENT DOCUMENTS

| | | | |
|---|---|---|---|
| 2004/0089931 A1 | 5/2004 | Nakajima et al. | |
| 2012/0319527 A1* | 12/2012 | Jahnes ................... | B81C 1/0015 |
| | | | 310/300 |
| 2014/0084476 A1* | 3/2014 | Lin ....................... | H01L 23/367 |
| | | | 257/774 |
| 2015/0255420 A1* | 9/2015 | Saito ................... | H01L 23/3157 |
| | | | 257/784 |
| 2018/0151719 A1* | 5/2018 | Sano ................... | H01L 29/0696 |
| 2021/0242086 A1* | 8/2021 | Gandrothula ..... | H01L 21/02458 |

FOREIGN PATENT DOCUMENTS

| | | |
|---|---|---|
| JP | 2001-274177 A | 10/2001 |
| JP | 2004-165406 A | 6/2004 |
| WO | 2013/137177 A1 | 9/2013 |

* cited by examiner

*Primary Examiner* — Fernando L Toledo
*Assistant Examiner* — Neil R Prasad
(74) *Attorney, Agent, or Firm* — Studebaker & Brackett PC

(57) ABSTRACT

The semiconductor device includes a substrate, a semiconductor element bonded to the substrate, and a sealing resin sealing at least a part of the substrate and the semiconductor element, in which the semiconductor element includes an active region through which a main current flows in an ON state of the semiconductor element, a terminal region surrounding the active region, an anchor film provided on an insulating film of the terminal region, and a protective film covering at least the terminal region including the anchor film, and the anchor film consists of a material different from the insulating film and has a plurality of openings provided discretely.

11 Claims, 6 Drawing Sheets

F I G. 6
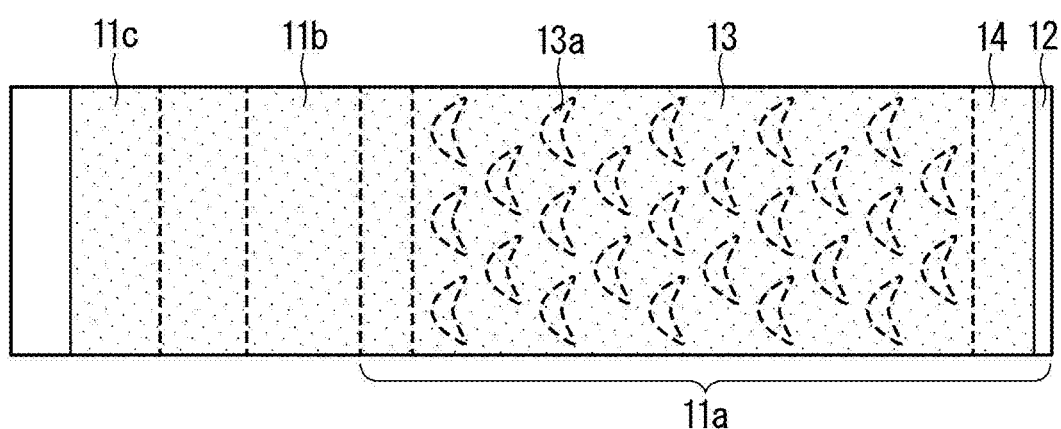

SEMICONDUCTOR DEVICE AND SEMICONDUCTOR ELEMENT

BACKGROUND OF THE INVENTION

Field of the Invention

The present invention relates to a semiconductor device, in particular, to a semiconductor device in which a semiconductor element is sealed with a resin, in which peeling of a protective film for protecting the semiconductor element is suppressed.

Description of the Background Art

Japanese Patent Application Laid-Open No. 2004-165406 discloses a semiconductor device in which a semiconductor element is sealed with a curable resin such as an epoxy resin. Further, Japanese Patent Application Laid-Open No. 2001-274177 discloses a semiconductor device in which electrode members are bonded to a front side and a back side of a semiconductor element, and at least a part of the electrode member and the semiconductor element are covered with a sealing resin. In recent years, in order to be able to cope with further loss reduction and high-temperature operation, SiC semiconductor elements consist of silicon carbide (SiC) have been developed and put into practical use. Such Sic semiconductor elements are also mounted on the above describe semiconductor device. In WO2013/137177, a semiconductor device is disclosed in which an insulating layer in which a first and a second insulating layers are laminated on a SiC layer is formed, the first insulating layer is provided with a through hole reaching the surface of the SiC layer, a second insulating layer is buried in the through hole to form a convex portion, and the convex portion improves the adhesion of the insulating layer.

SUMMARY

In a conventional semiconductor device, there has been a problem in that a semiconductor element receives a stress from a sealing resin due to a stress caused by a temperature cycle, a protective film on a surface of the semiconductor element is peeled off, and reliability thereof is reduced. In the semiconductor device having a structure disclosed in Japanese Patent Application Laid-Open No. 2001-274177, the stress applied to the semiconductor element is further increased, so that the probability that the protective film is peeled off is considered to be high. If the peeling of the protective film proceeds to, for example, a region that covers the gate wiring inside the terminal region, the gate wiring may be broken, and ultimately may result in a characteristic defect. In particular, in a semiconductor device on which a SiC semiconductor element is mounted, the Young's modulus of SiC is higher than that of Si; therefore, the stress applied to the protective film increases, and the peeling is more likely to progress. Also, even if the configuration disclosed in WO2013/137177 that improves the adhesion of the insulating layer is adopted, if the peeling cannot be completely suppressed, there are probabilities that the terminal region of the SiC semiconductor element having an intense electric field is exposed, electric discharge occurs from the peeled portion, and the breakdown voltage is reduced.

Provided is a semiconductor device in which a protective film on a surface of a semiconductor element is prevented from peeling even when the semiconductor element receives a stress from a sealing resin due to a stress caused by a temperature cycle.

According to the present invention, a semiconductor device includes a substrate, a semiconductor element bonded to the substrate, and a sealing resin sealing at least a part of the substrate and the semiconductor element, in which the semiconductor element includes an active region through which a main current flows in an ON state of the semiconductor element, a terminal region surrounding the active region, an anchor film provided on an insulating film of the terminal region, and a protective film covering at least the terminal region including the anchor film, and the anchor film consists of a material different from the insulating film and has a plurality of openings provided discretely.

According to the semiconductor device of the present invention, by providing the anchor film on the insulating film of the terminal region of the semiconductor element, even when the semiconductor element receives the stress from the sealing resin due to the stress caused by a temperature cycle, the protective film is hooked on the openings of the anchor film; therefore, the stress from the sealing resin is distributed and received on the protective film as a tensile stress. As a result, the compressive stress at the peeling tip can be made small and the protective film is prevented from peeling.

These and other objects, features, aspects and advantages of the present invention will become more apparent from the following detailed description of the present invention when taken in conjunction with the accompanying drawings.

BRIEF DESCRIPTION OF THE DRAWINGS

FIG. 6 is a partial plan view illustrating the configuration of the semiconductor element mounted on the semiconductor device of Embodiment 1 according to the present invention;

DESCRIPTION OF THE PREFERRED EMBODIMENTS

<Introduction>

Figure 1:
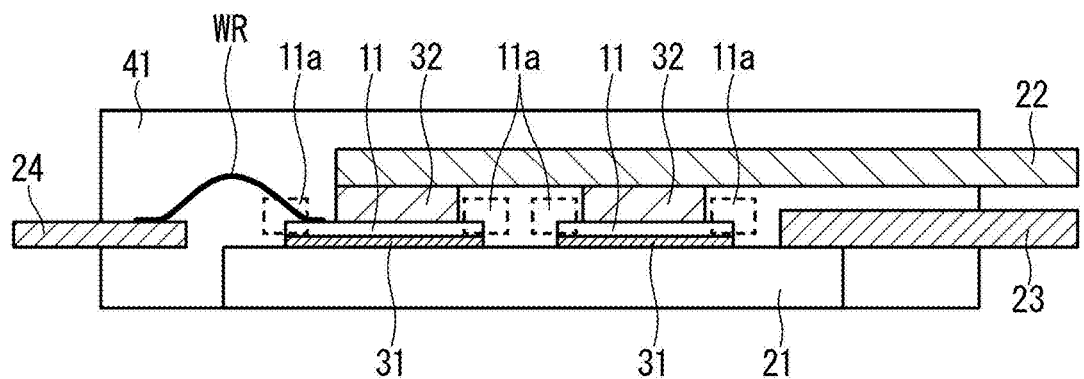
FIG. 1 is a cross-sectional view illustrating a configuration of a semiconductor device of Embodiment 1 according to the present invention.

In the following description, an "active region" is a region where a main current flows in an ON state of a semiconductor element. In the following, "outside" is a direction toward the outer periphery of the semiconductor element, and "inside" is a direction opposite to "outside". Further, although in the following description, regarding the conductivity type of impurities, n-type is generally defined as "first conductivity type", and p-type, which is a conductivity type opposite to n-type, is generally defined as "second conductivity type" the reversed definition opposite thereof may be adoptable. The drawings are schematically illustrated, and the correlation between the size and the position of the image illustrated in each of the different drawings is not necessarily accurately drawn, and can be changed as appropriate. In the following description, similar components are denoted by the same reference numerals, and have the same names and functions. Accordingly, detailed descriptions thereof may be omitted. Further, in the specification, the terms "on" and "cover" do not prevent the presence of inclusions between the components. For example, the terms "B provided on A" and "A covers B" can indicate both in terms of another component C being provided between A and B and in terms of another component C not being provided between A and B. Also although in the description described below, even when terms specifying specific positions and directions such as "up", "low", "side", "bottom", "front" or "rear" are used, these terms are used for convenience to facilitate understanding of the contents of Embodiment, and have no relation to the direction in actual implementation.

The term "MOS" was used for a metal-oxide-semiconductor junction structure in the past, and is the acronym of Metal-Oxide-Semiconductor. However, in a field effect transistor having a MOS structure in particular, (hereinafter, simply referred to as "MOS transistor"), materials of a gate insulating film and a gate electrode have been improved from the viewpoint of recent integration and improvement in a manufacturing process.

For example, in a MOS transistor, polycrystalline silicon has been employed instead of metal as a material for a gate electrode mainly from the viewpoint of forming a source and a drain in a self-aligning manner. Although, from the viewpoint of improving electrical characteristics, a material having a high dielectric constant is used as a material of the gate insulating film, the material is not necessarily limited to an oxide. Therefore, the term "MOS" is not necessarily limited to the metal-oxide-semiconductor lamination structure alone, and the present specification does not assume such a limitation. That is, in view of common general technical knowledge, "MOS" has a meaning here not only as an abbreviation derived from its word origin, but also broadly including a conductor-insulator-semiconductor lamination structure.

Embodiment 1

<Device Configuration>

Figure 2:
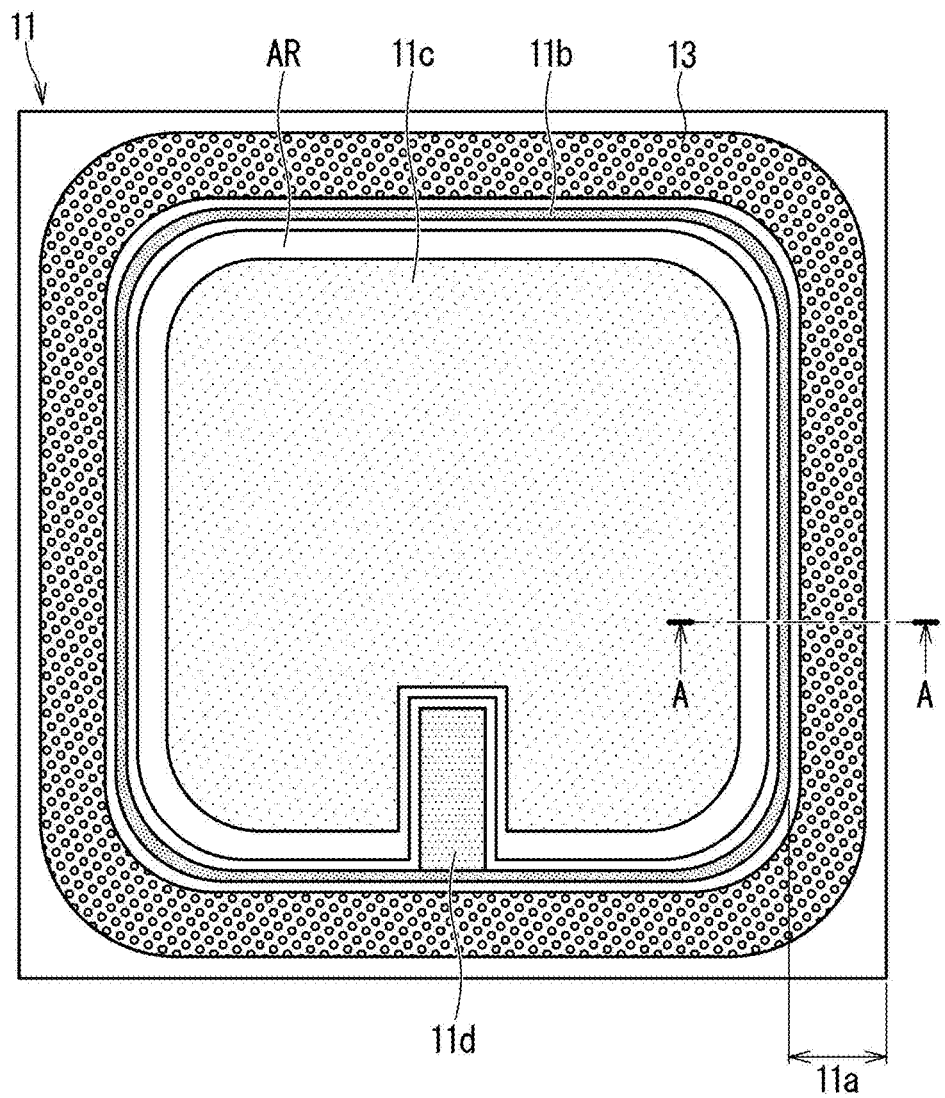
FIG. 2 is a plan view illustrating a configuration of a semiconductor element mounted on the semiconductor device of Embodiment 1 according to the present invention.

FIG. 1 is a cross-sectional view illustrating a configuration of a semiconductor device 1 according to Embodiment 1, and FIG. 2 is a plan view illustrating a configuration of semiconductor elements 11 mounted on the semiconductor device 1.

As illustrated in FIG. 1, the semiconductor device 1 includes a plurality of semiconductor elements 11 bonded on one main surface (upper surface) of a conductive substrate 21 via a bonding material 31 such as a solder material. In a semiconductor element 11, the lead frame 22 is bonded to the upper surface opposite to the lower surface bonded with the bonding material 31 via a bonding material 32 such as solder. The lead frame 22 is electrically connected to a source electrode (not shown) on the upper surface of the semiconductor elements 11, and one end of the lead frame 22 projects outside the semiconductor device 1.

One end of an external terminal 23 is connected to an edge portion of the upper surface of the conductive substrate 21, and the other end of the external terminal 23 projects outside the semiconductor device 1. The external terminal 23 is electrically connected to a drain electrode (not shown) on the lower surface of the semiconductor elements 11.

One end of a wire WR is connected to the upper surface of a semiconductor element 11*by* wire bonding, and the other end of the wire WR is connected to one end of the control terminal 24 by wire bonding. The other end of the control terminal 24 projects outside the semiconductor device 1. The wire WR is connected to a gate pad 11*d* (FIG. 2) of the semiconductor element 11, and a control signal is input from outside the semiconductor device 1 via the control terminal 24.

At least a portion of each of the lead frame 22, the external terminal 23, and the control terminal 24, the wire WR, the conductive substrate 21 and the semiconductor element 11 are sealed with a sealing resin 41, and the other end of each of the lead frame 22, the external terminal 23, and the control terminal 24 projects outside the sealing resin 41. The lower surface of the conductive substrate 21 is not covered with the sealing resin 41 and is exposed to the outside. Note that the configuration of the semiconductor device 1 illustrated in FIG. 1 is an example, and the present invention is not limited to this configuration.

As illustrated in FIG. 2, the semiconductor element 11 has a rectangular outer shape, and a central portion thereof is an active region AR. The active area AR in a plan view is a rectangle with four corners having a curvature, and the central part of one side thereof has a rectangular shape concave inward, and a gate pad 11*d* is formed such that the gate pad 11 enters into a portion concave inside the active area AR. On the active region AR, a source electrode 11*c* having substantially the same size and shape as the active region AR is provided.

Further, gate wiring 11*b* connected to one side of the gate pad 11*d* is provided along the outer periphery of the active region AR; that is, active region AR is surrounded by the gate wiring 11*b*. The arrangement and the shapes of the active region AR, the source electrode 11*c*, and the gate pad 11*d* in plan view are not limited to the above.

An anchor film 13 is provided on the further outer peripheral side of the gate wiring 11*b* along the gate wiring 11*b*. A region from the outer edge of the gate wiring 11*b* to the outer edge of the semiconductor element 11 including the anchor film 13 is defined as a terminal region 11*a*.

Figure 3:
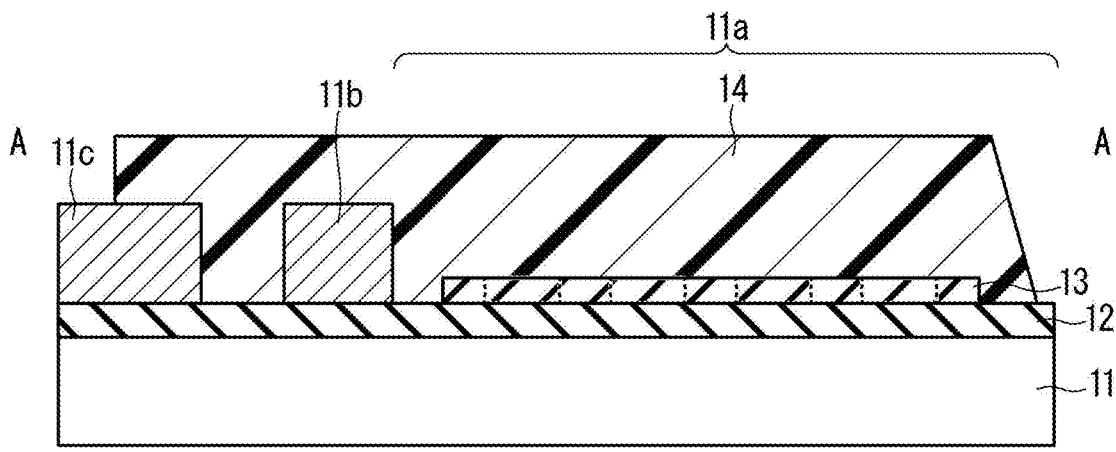
FIG. 3 is a partial sectional view illustrating the configuration of the semiconductor element mounted on the semiconductor device of Embodiment 1 according to the present invention.
Figure 4:
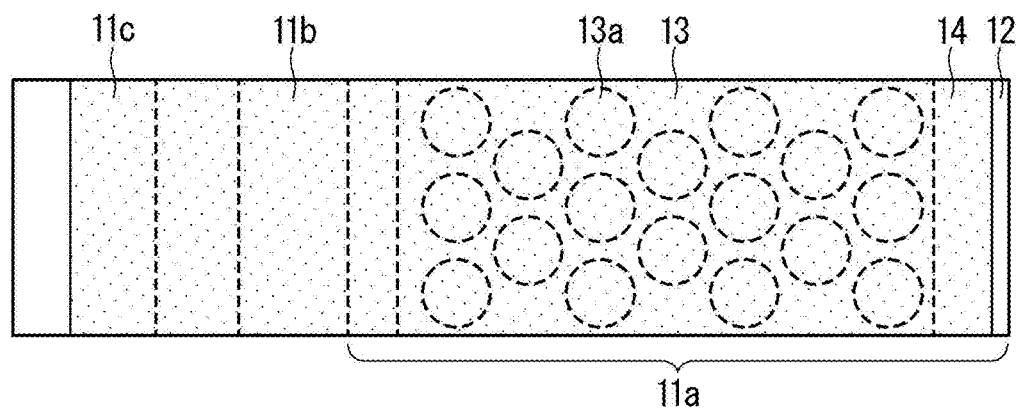
FIG. 4 is a partially plan view illustrating the configuration of the semiconductor element mounted on the semiconductor device of Embodiment 1 according to the present invention.

FIG. 3 is a cross-sectional view of a region indicated by line A-A with the arrows in FIG. 2, and FIG. 4 is a partial plan view of a region corresponding to FIG. 3.

As illustrated in FIG. 3, in the terminal region 11*a*, the anchor film 13 is provided on an interlayer insulating film 12, and a protective film 14 covering the interlayer insulating film 12 and the gate wiring 11b and covering at least a portion of the source electrode 11c is formed. The protective film 14 consists of a material different from that of the interlayer insulating film 12. Although not illustrated, an impurity region for maintaining breakdown voltage may be provided in the terminal region.

The semiconductor element 11 is a SiC semiconductor element (silicon carbide semiconductor element) consists of silicon carbide (SiC), includes a semiconductor layer epitaxially grown on a SiC wafer that is a semiconductor substrate, after a plurality of semiconductor element structures are formed on the SiC wafer through various wafer processes, the anchor film 13 is formed in the terminal region 11a of each semiconductor element structure, and the terminal region 11a is covered with the protective film 14. Thereafter, the SiC wafer is polished to a thickness of about 100 μm, and a plurality of semiconductor element structures are cut along a dicing line into individual pieces by, for example, a dicing method or the like, so that the semiconductor element 11 is obtained.

Although illustration and description of the semiconductor element structure of the semiconductor element 11 are omitted, it is assumed in Embodiment 1 that a MOS transistor is adopted. However, the semiconductor element 11 is not limited to a MOS transistor, an insulated gate bipolar transistor (IGBT), a pn junction diode, a Schottky diode, or the like may be adopted.

The protective film 14 consists of, for example, polyimide or polyamide as a main material. The protective film 14 is formed in a desired pattern through a photolithography process after applying a precursor solution for the protective film 14 on the SiC wafer by a spin coating method in a wafer process. As this pattern, for example, openings are formed above the source electrode 11c and the gate pad 11d of the MOS transistor, and the other region, that is, the region including the region where the terminal region 11a and the gate wiring 11b are formed is covered with the protective film 14.

More specifically, when dicing a semiconductor wafer using a disk-shaped blade grindstone, chipping or the like may occur during dicing, if the dicing line is covered with the protective film 14, and the yield rate may lowered. Therefore, the outer end surface of the protective film 14 is preferably provided so as to be located at a position retracted inward from the dicing line, so as not to contact the blade grindstone at the time of dicing, and is a pattern also having an opening above the dicing line. Therefore, as illustrated in FIG. 3, the outer end surface of the protective film 14 is located at a position retracted from the end surface of the semiconductor element 11. The retreat distance varies depending on the dicing conditions such as the blade width of the grinding blade, which is, for example, 20 to 100 μm.

The interlayer insulating film 12 consists of, for example, silicon oxide as a main material, and can be formed with an arbitrary thickness by a thermal oxidation method or a method of depositing a tetraethoxysilane (TEOS) oxide film using TEOS.

The terminal region 11a of the semiconductor element 11 is also a breakdown voltage holding region for maintaining a breakdown voltage and becomes a high electric field; therefore, the thickness and the formation area of the interlayer insulating film 12 covering the terminal region 11a are set such that at least the terminal region 11a is not exposed. The thickness of the interlayer insulating film 12 is set so that a leak current is not generated by a high electric field and the breakdown voltage is not reduced.

The anchor film 13 consists of, for example, silicon nitride as a main material. As illustrated in FIG. 2, the anchor film 13 is provided along the terminal region 11a in a plan view and has a loop shape. In addition, as illustrated in FIG. 4, the anchor film 13 is provided with a plurality of openings 13a discretely over the whole thereof.

The anchor film 13 is formed in a loop shape outside the gate wiring 11b so as to surround the gate wiring 11b and the active region AR; therefore, it is prevented that the peeling of the protective film 14 progresses and reaches the gate wiring 11b and the active region AR.

The anchor film 13 is formed by forming a silicon nitride film on the entire SiC wafer by a chemical vapor deposition method (CVD method) in a wafer process, then forming a resist film on the silicon nitride film, through a photolithography process, the resist film remains in a loop shape along the terminal region 11a, and at the same time, the resist film is patterned such that a plurality of openings 13a are discretely formed. Thereafter, a desired pattern is obtained by etching the silicon nitride film using the patterned resist film as an etching mask.

Here, the interlayer insulating film 12 consists of silicon oxide and the anchor film 13 consists of silicon nitride; therefore, etching selectivity can be obtained. Accordingly, removable of the interlayer insulating film 12 during the patterning process of the anchor film 13 can be suppressed.

The shape of the opening 13a of the anchor film 13 in plan view illustrated in FIG. 4 is a circular shape, and the minimum interval between the openings 13a is set to 5 μm or more and 20 μm or less.

By making the shape of the opening 13a a circular shape in plan view, it is possible to uniformly receive the tensile stress generated when the peeled protective film 14 is hooked on the openings 13a.

Figure 5:
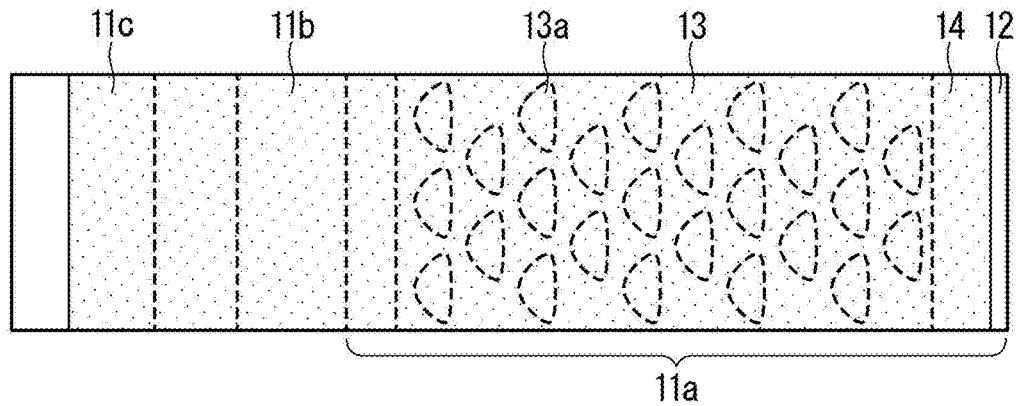
FIG. 5 is a partial plan view illustrating the configuration of the semiconductor element mounted on the semiconductor device of Embodiment 1 according to the present invention.

Further, the shape of the opening 13a in plan view is not limited to a circular shape, and may be, for example, a shape close to a semicircle (semicircular shape), as illustrated in FIG. 5, or, the shape may be a shape close to a crescent (crescent shape) as illustrated in FIG. 6. The side of inner side (on the side where the active region AR and the gate wiring 11b are formed) may be a circular arc shape, and the minimum interval between the openings 13a may be 5 μm or more and 20 μm or less.

The number of the openings 13a per unit area can be increased by making them a semicircular or a crescent shape, and the anchor effect of the protective film 14 by providing the openings 13a can be enhanced. The anchor effect is an effect of obtaining resistance to the horizontal stress with the elasticity of the protective film 14 due to the unevenness of the surface being hooked on the openings 13a.

<Manufacturing Method>

In order to mount the semiconductor element 11 having such a configuration on the semiconductor device 1, as illustrated in FIG. 1, when the semiconductor element 11 is a MOS transistor, the drain electrode serving as the lower surface is bonded to the conductive substrate 21 by using a bonding material 31 such as a solder material which is made of tin as a main material and a sinter material which is made of silver and copper as a main material.

The conductive substrate 21 is a substrate in which an insulating substrate (not shown) is mounted on a heat spreader (not shown) made of a material having good thermal conductivity such as copper, and a circuit pattern is formed on the upper surface of the insulating substrate. The drain electrode of the semiconductor element 11 is thermally and electrically connected to the circuit pattern with the bonding material 31.

The source electrode 11c serving as the upper surface of the semiconductor element 11 is bonded to the lead frame 22 made of copper as a main material by using a bonding material 32 such as a solder material which is made of tin as a main material and a sinter material which is made of silver and copper as a main material The source electrode 11c may be configured such that a wire made of aluminum or copper as a main material and having a diameter of hundreds of micro meters is mechanically bonded by wire bonding or the like, and the other end of the wire is connected to an external terminal.

After the mounting of the semiconductor element 11 on the conductor board 21 is completed, for example, a semi-finished product is mounted, in which the conductive substrate 21 and the semiconductor element 11 to which the lead frame 22 is bonded is mounted on a mold, and after injecting the molding resin into the mold under pressure, the sealing resin 41 is molded by a transfer mold sealing technique involving heating, whereby the semiconductor device 1 is completed.

Using an epoxy resin for the sealing resin 41 improves reliability such as moisture resistance and temperature cycle resistance, as compared with the case where a gel is used for the sealing material.

When a thermosetting resin is used as the sealing resin 41, the semiconductor element 11 receives the stress from the sealing resin 41 and a stress is generated on the semiconductor element 11 when the semiconductor device 1 receives the stress due to a temperature cycle, and the protective film 14 on the surface of the semiconductor element 11 is likely to be peeled off.

Therefore, the results of stress simulation of the stress generated at the interface between the protective film 14 and the semiconductor element 11 when the semiconductor device 1 is subjected to stress due to the temperature cycle will be described with reference to the sets of stress contour diagrams illustrated in FIGS. 7 to 9.

Figure 7:
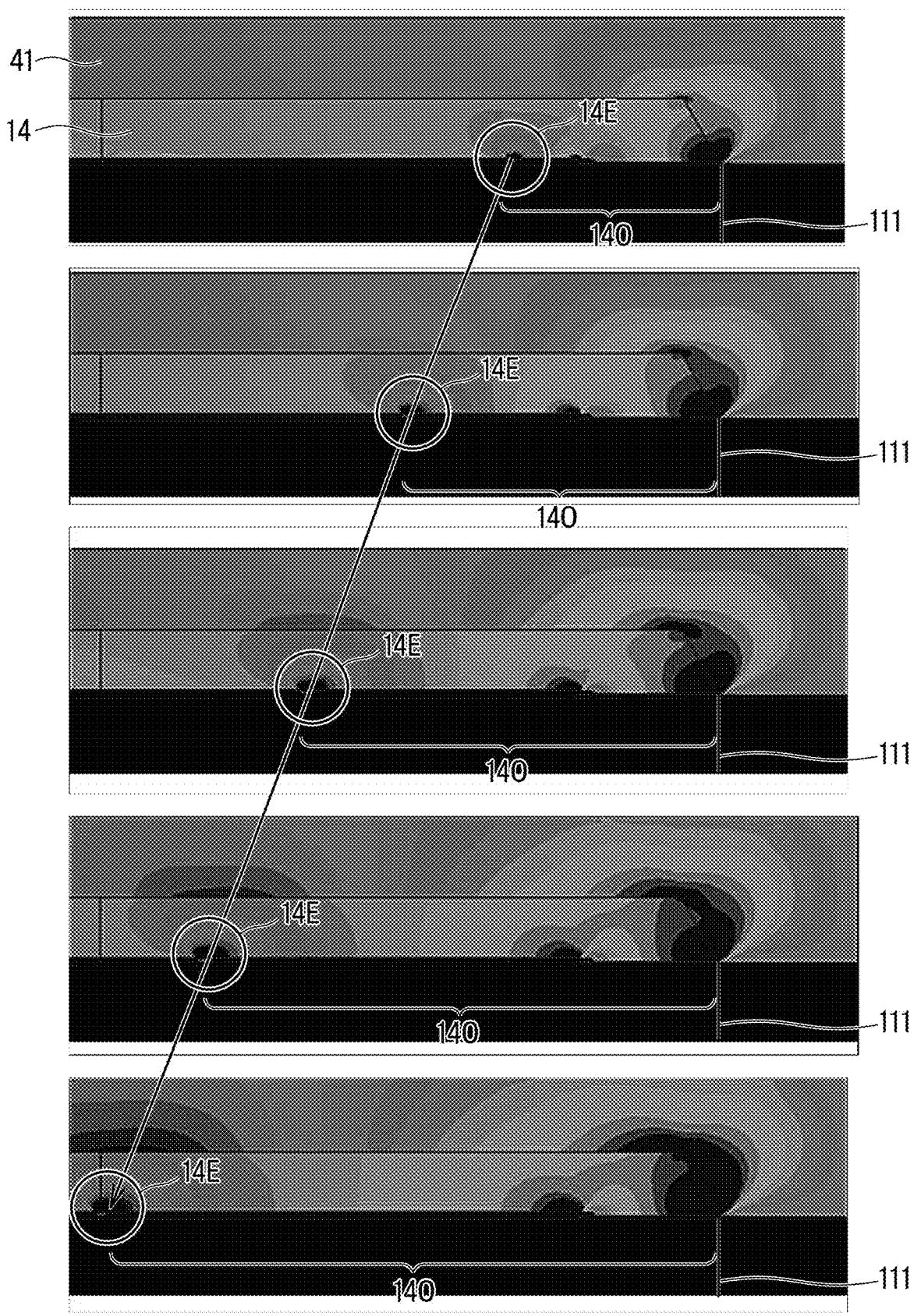
FIG. 7 is a set of contour diagrams illustrating a simulation result of stress generated at an interface between a protective film and a semiconductor element when stress is applied by a temperature cycle.

FIG. 7 is a set of stress contour diagrams illustrating a stress simulation result of the semiconductor element 111 having no anchor film 13 on the outer peripheral side of the gate wiring 11b.

In FIG. 7, the peeling of the protective film 14 starts from the end of the semiconductor element 111 as its starting point, and the change in the position of the peeling tip 14E when the peeling progresses inward (on the side of the source electrode 11c) is illustrated in order from the top.

In the uppermost stress contour diagram of FIG. 7, tensile stress peaks occur at the ends of the semiconductor element 111 and the protective film 14, and a compressive stress peak occurs at the peeling tip 14E. Note that, in FIGS. 7 to 9, the darker the color, the higher the stress.

As illustrated in the second stress contour diagram from the top, when the stress further increases, the peeling tip 14E moves inward, and the peeling region 140 expands. This is the same in the third, fourth, and fifth stress contour diagrams from the top as well: it can be understood that the peeling tip 14E moves inward and the peeling region 140 expands.

In addition, as illustrated in FIG. 7, it can be understood that the range of the peak of the tensile stress at the starting point of the peeling of the ends of the semiconductor element 111 and the protective film 14 increases with the progress of the peeling.

In the semiconductor element 111, when the peeling progresses inward on the terminal region 11a, the peak value of the compressive stress at the peeling tip 14E does not change and is maintained at a high value. That is, this indicates that once the peeling of the protective film 14 has occurred, the progress of the peeling of the protective film 14 cannot be suppressed. When the peeling of the protective film 14 proceeds further inward and reaches, for example, the gate wiring 11b, a short-circuit between the gate electrode and the source electrode and a decrease in the firing voltage between the gate electrode and the drain electrode occur, and the reliability of the semiconductor device decreases.

Figure 8:
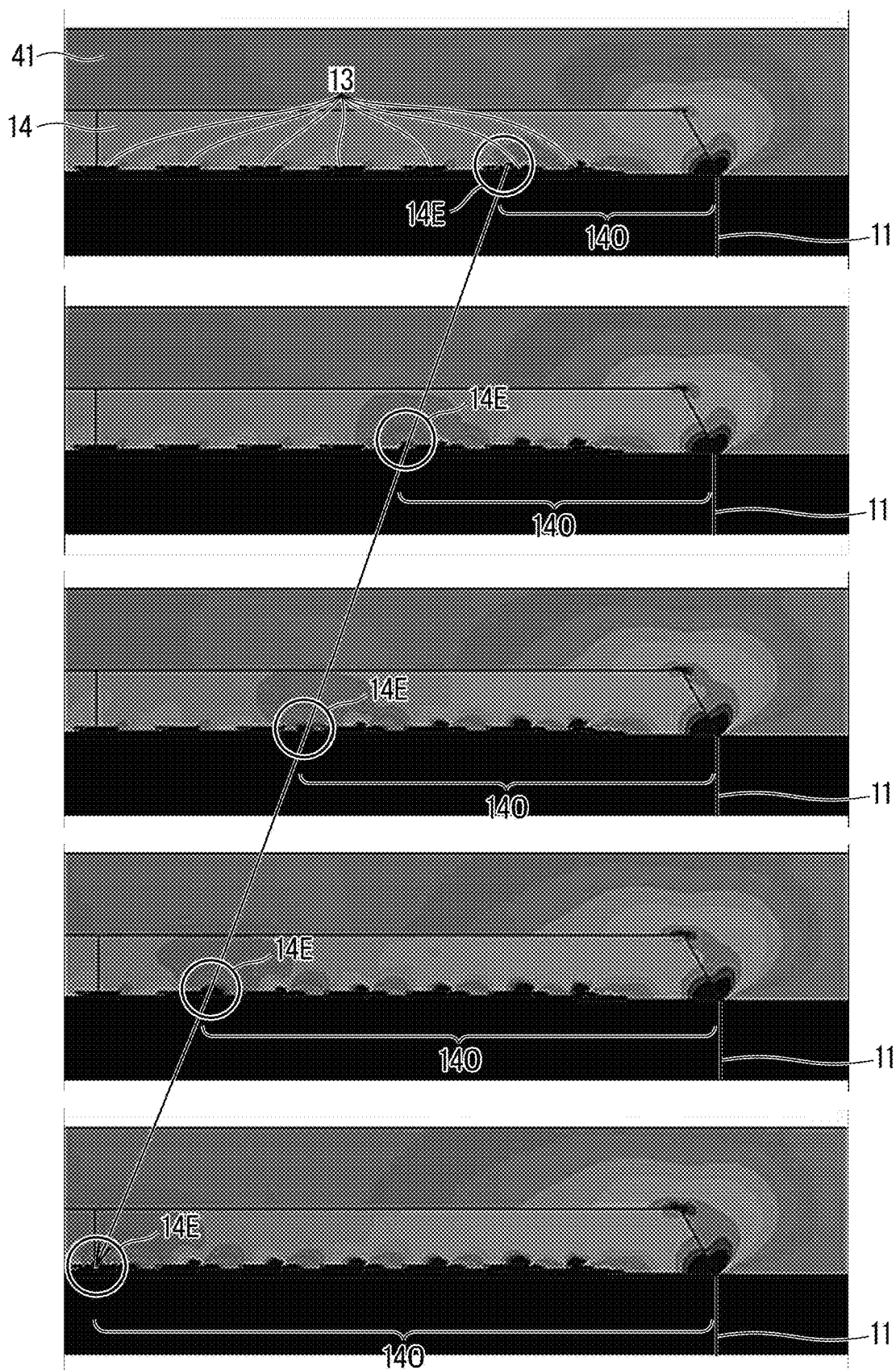
FIG. 8 is a set of contour diagrams illustrating a simulation result of stress generated at an interface between a protective film and a semiconductor element when stress is applied by a temperature cycle.

FIG. 8 is a set of stress contour diagrams illustrating a stress simulation result of the semiconductor element 11 having the anchor film 13 on the outer peripheral side of the gate wiring 11b, and indicates the stress simulation result in the case where the interval between the openings 13a of the anchor film 13 is 10 μm.

Also in FIG. 8, as in the same with FIG. 7, the peeling of the protective film 14 starts from the end of the semiconductor element 11 as its starting point, and the change in the position of the peeling tip 14E when the peeling progresses inward (on the side of the source electrode 11c) is illustrated in order from the top.

In the uppermost stress contour diagram of FIG. 8, tensile stress peaks occur at the ends of the semiconductor element 11 and the protective film 14, and a compressive stress peak occurs at the peeling tip 14E.

As illustrated in the second stress contour diagram from the top, when the stress further increases, the peeling tip 14E moves inward, and the peeling region 140 expands. This is the same in the third, fourth, and fifth stress contour diagrams from the top, although it is the same as the semiconductor element 111 in that the peeling tip 14E moves inward and the peeling region 140 expands, when the peeling progresses inward on the terminal region 11a, it can be understood that the protective film 14 is hooked on the anchor film 13 in the peeling region 140 outside the peeling tip 14E, and the tensile stress is distributed in the peeling region 140.

That is, in the stress contour diagrams of the second and lower from the top, there are a plurality of peak points of tensile stress in the peeled region 140, and in these portions, the protective film 14 is hooked on the openings 13a of the anchor film 13; therefore, the stress from the sealing resin 41 is distributed and received on the protective film 14 as a tensile stress. As a result, the peak of the compressive stress at the peeling tip 14E can be made smaller than that of the semiconductor element 111. This is also understood from the fact that, as compared with FIG. 7, even if the peeling progresses, the range of the peak of the tensile stress at the starting point of the peeling at the ends of the semiconductor element 11 and the protective film 14 does not become large.

If the peak of the compressive stress at the peeling tip 14E decreases, the progress of peeling can be suppressed, and if the progress of peeling can be suppressed, the speed at which peeling progresses further inward is reduced, and the longer life of the semiconductor device 1 can be realized.

Also, even if the peeling of the protective film 14 occurs from the outermost periphery of the semiconductor element 11 and progresses partway through the terminal region 11a, the state in which the silicon carbide layer in the terminal region 11a is covered with interlayer insulating film 12 is maintained, because the openings 13a of the anchor film 13 do not penetrate the interlayer insulating film 12, and exist only in the anchor film 13. Therefore, a deterioration phenomenon such as occurring of a discharge in the terminal region 11a does not occur, and a decrease in the breakdown voltage of the semiconductor element 11 can be suppressed.

Figure 9:
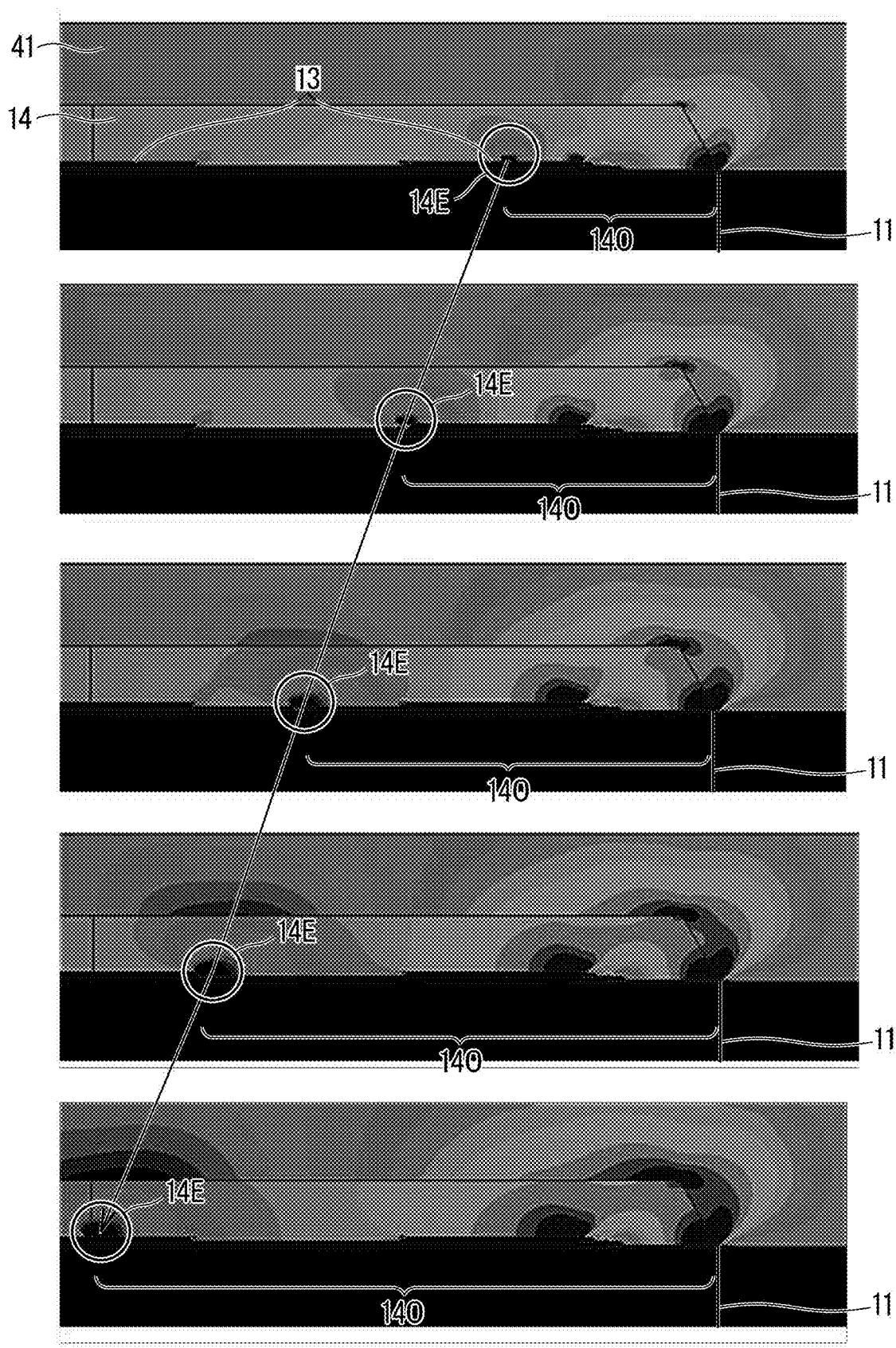
FIG. 9 is a set of contour diagrams illustrating a simulation result of stress generated at an interface between a protective film and a semiconductor element when stress is applied by a temperature cycle.

FIG. 9 is a set of stress contour diagrams illustrating a stress simulation result of the semiconductor element 11 having the anchor film 13 on the outer peripheral side of the gate wiring 11b, and indicates the stress simulation result in the case where the interval between the openings 13a of the anchor film 13 is 50 μm.

Also in FIG. 9 as in the same with FIG. 8, the peeling of the protective film 14 starts from the end of the semiconductor element 11 as its starting point, and the change in the position of the peeling tip 14E when the peeling progresses inward (on the side of the source electrode 11c) is illustrated in order from the top.

In the uppermost stress contour diagram of FIG. 9, in the sense that tensile stress peaks occur at the ends of the semiconductor element 11 and the protective film 14, and a compressive stress peak occurs at the peeling tip 14E, it is the same as in FIG. 8. However, as can be seen from the stress contour diagrams of the second and lower from the top, the compressive stress of the peeling tip 14E is not distributed and received on the anchor film 13 because of less hooking portions of the protective film 14 on the openings 13a in the peeling region 140 outside the peeling tip 14E. This is presumably because the extension of the protective film 14 per se prevents the sufficient holding of the compressive stress generated at the peeling tip 14E with the hooking on the openings 13a of the anchor film 13.

Accordingly, designing of the intervals between the openings 13a of the anchor film 13 in accordance with the Young's modulus and the yield strength of the protective film 14 is required. When the protective film 14 is formed of polyimide, the interval between the openings 13a is 5 μm or more and 20 μm or less is preferable in consideration of a change in pattern dimensions, such as shrinkage after baking the polyimide. Thereby both the stress reduction effect and pattern accuracy can be achievable.

For example, the interlayer insulating film 12 is formed of silicon oxide, the anchor film 13 is formed of silicon nitride, and the protective film 14 is formed of polyimide, so that the interlayer insulating film 12 and the anchor film 13 are made harder than the protective film 14 as materials. This ensures that, when the peeling of the protective film 14 occurs, the stress is distributed by the deformation of the protective film 14, and accordingly, the peeling of the anchor film 13 and the cracking of the interlayer insulating film 12 can be prevented. Further, formation is readily performed by a conventional wafer process with the above materials being used for each of the films; therefore, an increase in manufacturing cost can be suppressed.

Further, by making the shape of the side of inner side (on the side where the active region AR and the gate wiring 11b are formed) of the opening 13a of the anchor film 13 a circular shape, the tensile stress generated when the peeled protective film 14 is hooked thereon can be distributed and the peeling of the anchor film 13 is prevented.

Furthermore, by arranging the openings 13a discretely, the compressive stress can be distributed in a plane within the plane of the terminal region 11a when the peeling of the protective film 14 occurs, and local peeling can be prevented from progressing.

In the semiconductor device 1 of Embodiment 1 described above, although the semiconductor element 11 is a SiC semiconductor element, Si semiconductor element consist of silicon may be adoptable.

SiC has a dielectric breakdown strength about 10 times higher than that of Si and the thickness of the semiconductor layer can be reduced to about 1/10 of that of Si; therefore, the SiC semiconductor device can achieve low on-voltage and can operate even at high temperatures. Accordingly, the SiC semiconductor device can be made smaller and more efficient than the Si semiconductor device.

Further, the semiconductor element 11 is not limited to being mounted on the semiconductor device 1 having the configuration illustrated in FIG. 1, but may be mounted on a semiconductor device in which the semiconductor element is sealed with resin. Thus, the same effect as the above-described effect can be obtained.

It should be noted that Embodiment of the present invention can be appropriately modified or omitted without departing from the scope of the invention.

While the invention has been shown and described in detail, the foregoing description is in all aspects illustrative and not restrictive. It is therefore understood that numerous modifications and variations can be devised without departing from the scope of the invention.

What is claimed is:

1. A semiconductor device comprising:
   a substrate;
   a semiconductor element bonded to the substrate; and
   a sealing resin sealing at least a part of the substrate and the semiconductor element, wherein
   the semiconductor element includes
      an active region through which a main current flows in an ON state of the semiconductor element,
      a terminal region surrounding the active region,
      an anchor film provided on an insulating film of the terminal region, and
      a protective film covering at least the terminal region including the anchor film, and
   the anchor film consists of a material different from the insulating film and has a plurality of openings provided discretely.

2. The semiconductor device according to claim 1, wherein
   the anchor film is provided along the terminal region in a plan view and has a loop shape.

3. The semiconductor device according to claim 1, wherein
   the plurality of openings have a shape in which at least a side on the active region side is an arc shape in plan view.

4. The semiconductor device according to claim 3, wherein
   the plurality of openings have a circular shape in plan view.

5. The semiconductor device according to claim 3, wherein
   the plurality of openings have a semicircular shape in plan view.

6. The semiconductor device according to claim 3, wherein
   the plurality of openings have a crescent shape in plan view.

7. The semiconductor device according to claim 1, wherein
   a minimum interval between the openings is 5 μm or more and 20 μm or less.

8. The semiconductor device according to claim 1, wherein
   The semiconductor element is a silicon carbide semiconductor element.

9. The semiconductor device according to claim 1, wherein
 the protective film is a film consists of polyimide or polyamide as a main material.

10. The semiconductor device according to claim 1, wherein
 the anchor film is a film consists of silicon nitride as a main material.

11. A semiconductor element comprising:
 an active region through which a main current flows in an ON state;
 a terminal region surrounding the active region;
an anchor film provided on an insulating film of the terminal region; and
 a protective film covering at least the terminal region including the anchor film, wherein
 the anchor film consists of a material different from the insulating film and has a plurality of openings provided discretely over the whole thereof.

* * * * *